(12) United States Patent
So et al.

(10) Patent No.: US 6,414,904 B2
(45) Date of Patent: Jul. 2, 2002

(54) TWO CHANNEL MEMORY SYSTEM HAVING SHARED CONTROL AND ADDRESS BUS AND MEMORY MODULES USED THEREFOR

(75) Inventors: Byung-se So, Sungnam; Myun-joo Park, Incheon; Sang-won Lee, Gunpo, all of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/777,547

(22) Filed: Feb. 6, 2001

(30) Foreign Application Priority Data

Jun. 30, 2000 (KR) .............................. 00-37399

(51) Int. Cl.⁷ ................................. G11C 8/00
(52) U.S. Cl. ................... 365/239; 365/189.04; 711/127
(58) Field of Search ....................... 365/51, 63, 230.05, 365/189.04, 189.08, 239, 230.09; 711/5, 127

(56) References Cited

U.S. PATENT DOCUMENTS

| | | | |
|---|---|---|---|
| 5,367,632 A | * 11/1994 | Bowen et al. | 395/194 |
| 5,479,624 A | * 12/1995 | Lee | 395/401 |
| 5,490,253 A | 2/1996 | Laha et al. | 395/304 |
| 5,860,080 A | 1/1999 | James et al. | 711/4 |
| 6,016,282 A | 1/2000 | Keeth | 365/233 |
| 6,128,748 A | * 10/2000 | MacWilliams et al. | 713/401 |
| 6,334,159 B1 | * 12/2001 | Haupt | 710/6 |

* cited by examiner

Primary Examiner—Richard Elms
Assistant Examiner—Hien Nguyen
(74) Attorney, Agent, or Firm—Mills & Onello LLP

(57) ABSTRACT

A memory system, which can improve the operation speed of a data bus and is suitable for widening bandwidth by extending the width of the data bus, and memory modules used for the memory system are provided. In the memory system, data buses of a first channel and data buses of a second channel are extended from a memory controller and are arranged on the left and right of a common control and address bus, respectively. Memory modules of a first group are loaded in the data buses of the first channel and memory modules of a second group are loaded in the data buses of the second channel. Also, in the memory system, the memory modules share the common control and address bus positioned in the center. Also, the memory modules are arranged so that some parts of the memory modules overlap each other and that the memory modules of the first group and the memory modules of the second group cross each other. Each of the memory modules includes a plurality of memory devices mounted on the memory module, a signal input and output portion positioned on a side of the memory module, the signal input and output portion for connecting the memory module to a connector on a system board, a buffer mounted on the memory module, and a control and address bus connected between the signal input and output portion and the buffer. The memory devices are sequentially connected to the output line of the buffer so that a signal that passed through the control and address bus is input to the respective memory devices at time intervals through the buffer.

24 Claims, 3 Drawing Sheets

TWO CHANNEL MEMORY SYSTEM HAVING SHARED CONTROL AND ADDRESS BUS AND MEMORY MODULES USED THEREFOR

BACKGROUND OF THE INVENTION

1. Field of the Invention

The present invention relates to a memory system and memory modules, and more particularly, to a two channel memory system having a shared control and address bus and memory modules used therefor.

2. Description of the Related Art

Memory devices continue to be developed with a higher degree of integration, and with larger capacity based on the increased degree of integration. At the same time, central processing units (CPU) at the centers of computer systems continue to be developed to operate at increased speed. As a result, the disparity between the operation speed of the CPU and the operation speed of the memory continues to increase to a point where, in contemporary systems, the operation speed of the memory device tends to restrict the overall performance of the computer system.

Accordingly, in order to increase the operation speed of the computer system, research has been conducted for the development of high performance memory systems as well as high speed memory devices. Development of high performance memory systems is generally focused on constructing memories capable of inputting and outputting a greater amount of data within a unit time. In order to increase the operation speed of the memory system, a high speed memory device must be first developed. However, interface architectures of memory modules and buses, which can increase system operation speed for connecting the memory device to external components, can also be very important. That is to say, technologies having to do with the arrangement of communication buses and construction of the memory modules used for installing the memory devices on the buses, are very important.

Bandwidth of the memory device, meaning the amount of data input to and output from the memory device within a unit time, is dependent on the width of the data bus and operation speed of the memory device and the data bus. The width of the data bus is affected by the physical area of a system memory region or the spatial arrangement of bus lines. The operation speed of the data bus is affected by the electrical high frequency characteristic of the data bus. Therefore, in order to improve the bandwidth, that is, in order to increase the operation speed of the memory system, ways of making the utmost use of the restricted space assigned to the memory region in the computer system and satisfying various electrical characteristics that are in question in the high frequency regime, must be found.

SUMMARY OF THE INVENTION

It is an object of the present invention to provide a memory system capable of increasing the operation speed of a data bus and capable of readily extending the width of the data bus.

It is another object of the present invention to provide a memory module capable of improving the operation speed of a data bus and capable of readily extending the width of the data bus.

Accordingly, to achieve the first object, there is provided a memory system, comprising a system board; a memory controller on the system board; a plurality of memory modules on the system board; a common control and address bus extending from the memory controller; data buses of a first channel extending from the memory controller; and data buses of a second channel extending from the memory controller. The memory modules of a first group are coupled to the data buses of the first channel and the memory modules of a second group are coupled to the data buses of the second channel. The memory modules of the first and second groups share the common control and address bus.

The memory modules can be arranged so that some parts of the memory modules overlap each other. The memory modules of the first group and the memory modules of the second group can also be arranged to cross each other. In a preferred embodiment, the memory modules of the first group and the memory modules of the second group are identical in configuration. Alternatively, the memory modules of the first group and the memory modules of the second group can be configured as mirror images of each other.

Each of the memory modules may comprise a plurality of memory devices mounted on the memory module; a signal input and output portion positioned on a side of the memory module, the signal input and output portion for connecting the memory module to a connector on the system board; a buffer mounted on the memory module; and a control and address bus connected between the signal input and output portion and the buffer. In this embodiment, the memory devices are preferably sequentially connected to the output line of the buffer so that a signal passing through the control and address bus is input to the respective memory devices at time intervals through the buffer. The control and address bus may be input through an input pin of the signal input and output portion, passes through the buffer, and is output through an output pin of the signal input and output portion, which is in the form of a short loop-through configuration. Alternatively, the control and address bus may diverge from the common control and address bus on the system board, which is in the form of a stub configuration.

Each of the memory modules may further comprise a plurality of data buses formed between the input pin and the output pin of the signal input and output portion in the form of the short loop-through configuration and connected to at least one memory device.

The control and address bus and the buffer may be arranged on a side of the memory module, and extend vertically from an edge of the memory module on which the signal input and output portion is positioned.

A register may be mounted on the memory module instead of the buffer.

The data buses of the first channel may be arranged on the left side and the data buses of the second channel may be arranged on the right side of the common control and address bus.

In another aspect, the present invention comprises a memory system, comprising: a system board; a memory controller on the system board; a plurality of memory modules on the system board; a common control and address bus extending from the memory controller; and data buses of a first channel and data buses of a second channel, extending from the memory controller and alternately arranged from side to side in the same direction as the extension of the common control and address bus. Memory modules of the a group are loaded in the data buses of the first channel and memory modules of a second group are loaded in the data buses of the second channel, the memory modules of the first and second groups being coupled to the common control and address bus, and the memory modules of the first group and the memory modules of the second group being alternately arranged in orientation.

BRIEF DESCRIPTION OF THE DRAWING(S)

The above object and advantages of the present invention will become more apparent by describing in detail preferred embodiments thereof with reference to the attached drawings in which.

DETAILED DESCRIPTION OF PREFERRED EMBODIMENTS

Figure 1:
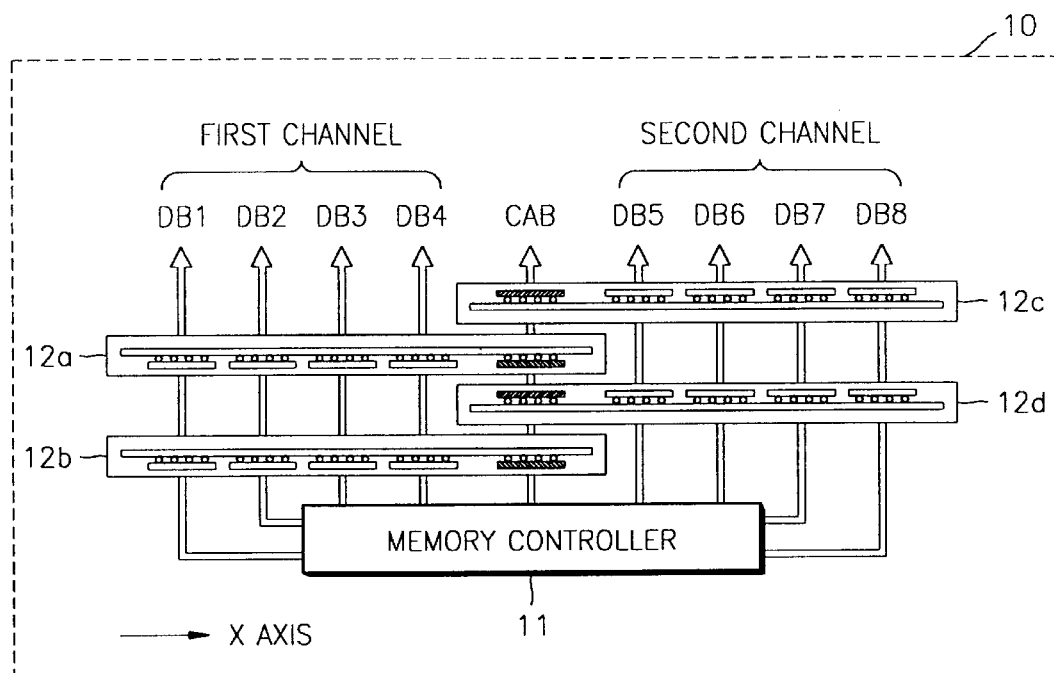
FIG. 1 is a block diagram of a memory system according to a first embodiment of the present invention.

The present invention now will be described more fully with reference to the accompanying drawings, in which preferred embodiments of the invention are shown. The same reference numerals in different drawings represent the same element.

FIG. 1 illustrates a memory system according to a first embodiment of the present invention.

Referring to FIG. 1, in the memory system according to the first embodiment of the present invention, a memory controller 11 is provided at a predetermined position on a system board 10 and a common control and address bus CAB extends from the memory controller 11. Data buses DB1 through DB4 of a first channel extend from the memory controller 11 and are arranged on the left side of the common control and address bus CAB. Data buses DB5 through DB8 of a second channel extend from the memory controller 11 and are arranged on the right side of the common control and address bus CAB. Memory modules 12a and 12b of a first group are loaded in the data buses DB1 through DB4 of the first channel and memory modules 12c and 12d of a second group are loaded in the data buses DB5 through DB8 of the second channel.

Accordingly, in the memory system according to the first embodiment of the present invention, the width of a data bus on the system board 10 doubles the width of a data bus on the memory modules. Therefore, it is possible to construct a wide band memory system using relatively small memory modules.

Also, in the memory system according to the first embodiment of the present invention, all of the memory modules 12a, 12b, 12c, and 12d, both to the left and right of the central common control and address bus CAB, share the common control and address bus CAB. In a case where all the memory modules loaded in the first and second channels share the common control and address bus CAB, the number of pins of the memory controller 11 and the number of bus lines on the system board 10 are smaller than the conventional case where each channel has an independent control and address bus. Accordingly, the arrangement of interconnection lines on the system board 10 is relatively simpler.

During operation of the system, address signals for addressing memory devices on the memory modules 12a, 12b, 12c, and 12d, and control signals for controlling the memory devices on the memory modules 12a, 12b, 12c, and 12d, for example control commands, are transmitted from the memory controller 11 to the memory modules 12a, 12b, 12c, and 12d through the control and address bus CAB. Data signals are transmitted from the memory controller 11 to the memory modules 12a, 12b, 12c, and 12d or from the memory modules 12a, 12b, 12c, and 12d to the memory controller 11 through the data buses DB1 through DB4 of the first channel and the data buses DB5 through DB8 of the second channel.

In the memory system according to the first embodiment of the present invention, the memory modules 12a, 12b, 12c, and 12d are arranged so that the components connected to the common control and address bus CAB overlap each other and so that the memory modules 12a and 12b of the first group and the memory modules 12c and 12d of the second group are in line with each other. Accordingly, the memory system can be appropriately arranged in a restricted region of an entire system, since the size of the memory system along the direction of the X axis is reduced. Also, in a data bus region, where a large amount of heat is generated during high speed operation, it is easier to emit the excess heat, since sufficient intervals are provided between the memory modules.

Figure 2:
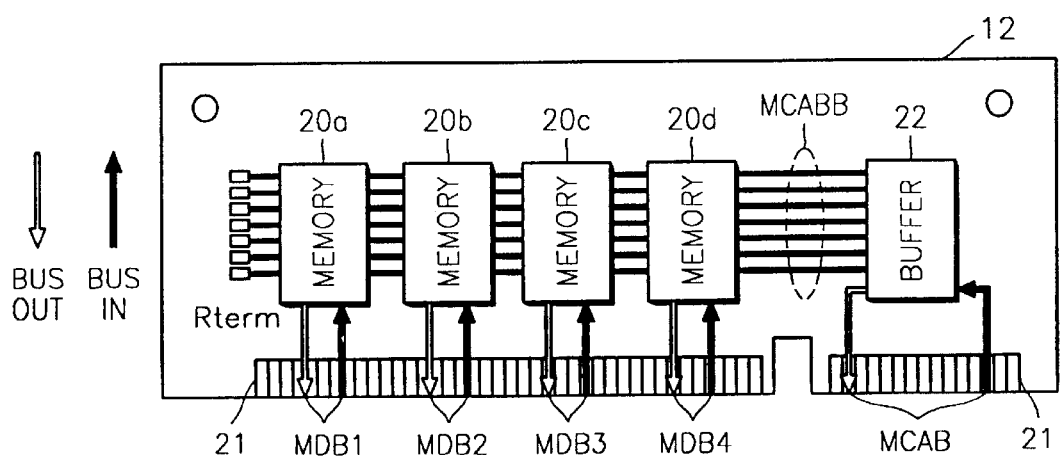
FIG. 2 is a detailed block diagram of the memory module of FIG. 1, in accordance with the present invention.

FIG. 2 is an illustrative detailed block diagram of a memory module shown in FIG. 1, according to the present invention.

Referring to FIG. 2, a memory module 12 according to the present invention includes a plurality of memory devices 20a through 20d, a tab 21, a plurality of data buses MDB1 through MDB4, a control and address bus MCAB, and a buffer 22.

The memory devices 20a through 20d are mounted at predetermined positions on the memory module 12. The data buses MDB1 through MDB4 are provided in a short loop-through configuration, and are connected between the tab 21 and the memory devices 20a through 20d. The tab 21, that is a signal input and output portion, is positioned on an edge of the memory module 12 and connects the memory module 12 to a connector on a system board.

When the memory module 12 is loaded in the memory system shown in FIG. 1, the data buses MDB1 through MDB4 on the memory module 12 are connected to the data buses DB1 through DB4 of the first channel or the data buses DB5 through DB8 of the second channel on the system board 10. The control and address bus MCAB on the memory module 12 is connected to the common control and address bus CAB on the system board 10.

The control and address bus MCAB and the buffer 22 are arranged on a side (for example, a right side in FIG. 2) of the module and extend vertically from the edge on which the tab 21 is positioned. The control and address bus MCAB is in the form of a short loop-through configuration and is connected between the tab 21 and the buffer 22. A bus line MCABB, for example in a stub configuration, is connected to the output port of the buffer 22. The memory devices 20a through 20d are sequentially connected to the bus line or the stub MCABB, such that a signal that passed through the control and address bus MCAB is input to the respective memory devices 20a through 20d at uniform time intervals through the buffer 22. The buffer 22 is used for improving the integrity of the signal that passed through the control and address bus MCAB. In alternative configurations, a register can be used instead of the buffer 22.

Accordingly, in the memory modules according to the present invention, since the memory devices 20a through 20d are sequentially operated at uniform time intervals during the operation of the system, high frequency simultaneous switching noise generated when data are simultaneously output from the memory devices 20a through 20d, is reduced. Therefore, high speed operation characteristics are improved.

In the memory module shown in FIG. 2, the control and address bus MCAB is in the form of a short loop-through configuration. The control and address bus MCAB can alternatively be in the form of a stub configuration. In the control and address bus MCAB in the form of the short loop-through, as shown in FIG. 2, a bus line is input to the memory module 12 through an input pin of the tab 21, passes through the buffer 22, and is output through an output pin of the tab 21. In the control and address bus in the form of the stub, the stub that operates as the control and address bus is connected between the tab 21 and the buffer 22. When the memory module is loaded in the memory system shown in FIG. 1, the control and address stub on the memory module diverges from the common control and address bus CAB on the system board 10.

In the memory system according to the first embodiment of the present invention, which is shown in FIG. 1, and the memory module shown in FIG. 2, the data bus in the form of the short loop-through is used. In the data bus in the form of the short loop-through, data flows to cross the memory modules 12a, 12b, 12c, and 12d as marked by the arrows of the data buses DB1 through DB8 of FIG. 1. In the respective memory modules, as shown in FIG. 2, the bus line is input to the memory module 12, passes through the memory devices 20a through 20d, and is output. In this process, the tab 21 includes both an input pin and an output pin for each bit on the data bus.

As mentioned above, in the memory system according to the first embodiment of the present invention, which is shown in FIG. 1, the memory modules 12a and 12b of the first group, which are connected to the first channel, and the memory modules 12c and 12d of the second group, which are connected to the second channel, share the common control and address bus CAB and are arranged symmetrically on the left and right sides of the common control and address bus CAB, respectively. Accordingly, in the tab 21 shown in FIG. 2, pins in the memory modules 12a and 12b of the first group are arranged in an order inverse to the order, in which pins in the memory modules 12c and 12d of the second group are arranged. Accordingly, input and output pins for the control and address bus MCAB of the memory modules 12a, 12b, 12c, and 12d are not arranged in parallel in the direction of the bus. Therefore, wiring of the bus ma become complicated.

In order to solve the above problem, mirror image modules, in which the left and the right of the modules are reversed, can be additionally designed and used. However, the manufacturing cost increases when two types of modules are designed and manufactured. Therefore, in the present invention, the board wiring method described in FIG. 3 is used so that only one-type of memory module is required.

Figure 3:
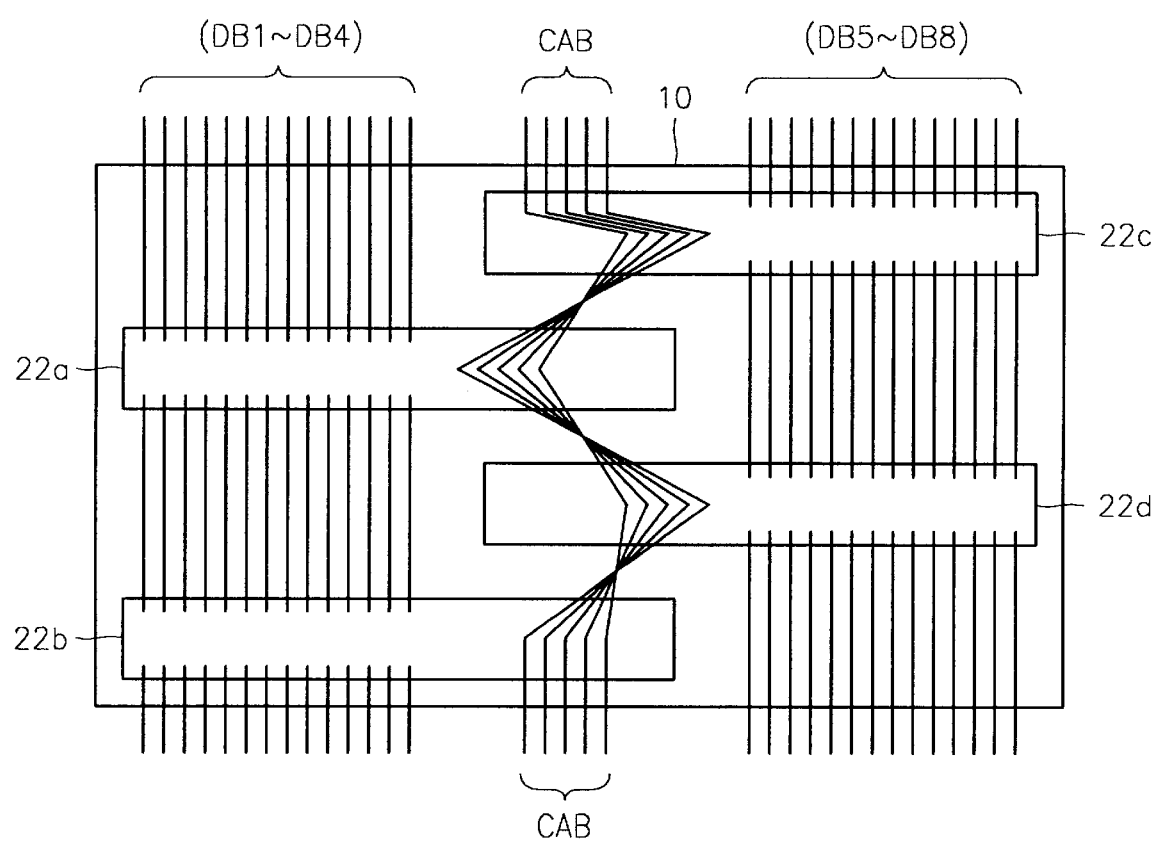
FIG. 3 is a layout diagram for wiring a board in a memory system according to the embodiment of FIG. 1 according to the present invention.

FIG. 3 describes the method for wiring the board in the memory system according to the first embodiment of the present invention, which is shown in FIG. 1. Reference numeral 10 denotes a system board and reference numerals 22a through 22d denote regions in which module sockets are loaded.

Referring to FIG. 3, the data buses DB1 through DB8 are wired in the form of a straight line and the common control and address bus CAB is wired to alternately reciprocate from side to side. In order to make such wiring possible, in the memory module shown in FIG. 2, the input pins and the output pins of the control and address bus MCAB are arranged on opposite sides of the buffer 22.

Accordingly, the output pins of the control and address bus MCAB in one memory module, for example, the memory module installed in the region 22d are positioned in the same point as the input pins of the control and address bus MCAB in the next memory module, in which pins are arranged in the inverse order, for example, in the memory module loaded in the region 22a. Also, the output pins of the control and address bus MCAB and the input pins of the control and address bus MCAB in the two modules are connected to each other by straight lines on the system board 10 as shown in FIG. 3.

Accordingly, one-type of memory modules can be used for the memory system according to the first embodiment of the present invention, which is shown in FIG. 1, by the above-mentioned wiring method.

Figure 4:
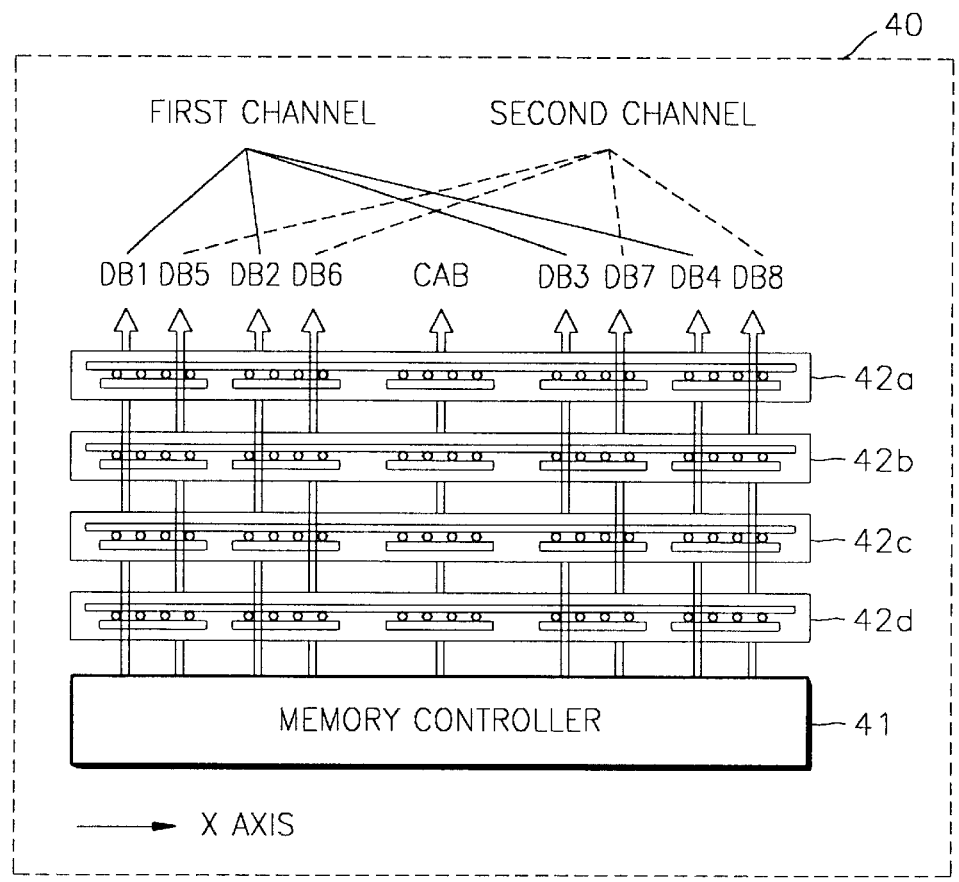
FIG. 4 is a block diagram of a memory system according to a second embodiment of the present invention.

FIG. 4 is a block diagram of a memory system according to a second embodiment of the present invention.

Referring to FIG. 4, in the memory system according to the second embodiment of the present invention, a memory controller 41 is provided in a predetermined position on a system board 40 and a common control and address bus CAB extends from the memory controller 41. The data buses DB1 through DB4 of the first channel and the data buses DB5 through DB8 of the second channel extend from the memory controller 41 and are alternately arranged one by one on the left and right along the direction as the direction of the control and address bus CAB. Memory modules 42a and 42c of a first group are loaded on the data buses DB1 through DB4 of the first channel and memory modules 42b and 42d of a second group are loaded in the data buses DB5 through DB8 of the second channel.

Accordingly, in the memory system according to the second embodiment of the present invention, the width of a data bus on the system board 40 doubles the width of a data bus on the memory modules, in a manner similar to the memory system according to the first embodiment. Therefore, it is possible to construct a wide band memory system using relatively small memory modules.

Also, in the memory system according to the second embodiment of the present invention, all the memory modules 42a, 42b, 42c, and 42d share the common control and address bus CAB positioned in the center of the module. Also, the memory modules of the first group, that is, the memory modules 42a and 42c loaded in the data buses DB1 through DB4 of the first channel and the memory modules of the second group, that is, the memory modules 42b and 42d loaded in the data buses DB5 through DB8 of the second channel are alternately arranged in alternate orientations in generally linear fashion, as shown.

Accordingly, in the memory system according to the second embodiment of the present invention, the number of pins of the memory controller 41 and the number of bus lines on the system board 40 are reduced, as in the memory system according to the first embodiment. Also, since all the memory modules 42a, 42b, 42c, and 42d are arranged in a line, the size of the memory system in the direction of the X axis is reduced. Accordingly, the area occupied by the system is relatively small and the arrangement of the lines on the system board 40 becomes relatively simpler, as compared to conventional layouts.

In the memory system according to the second embodiment, which is shown in FIG. 4, since all the memory modules 42a, 42b, 42c, and 42d are arranged in a line, the architecture of the control and address bus on the memory module is less restricted than in the memory system according to the first embodiment of the present invention, which is shown in FIG. 1. In the memory system according to the second embodiment, which is shown in FIG. 4, the memory module, in which the data buses and the control and address bus are in the form of the short loop-through, and the memory module, in which the data buses are in the form of the short loop-through and the control and address bus is in the form of the stub, can be selectively used, as in the memory system according to the first embodiment. However, in the memory module used for the memory system according to the second embodiment, which is shown in FIG. 4, the control and address bus and the buffer are arranged at the center of the module, unlike in the memory module shown in FIG. 2.

Figure 5:
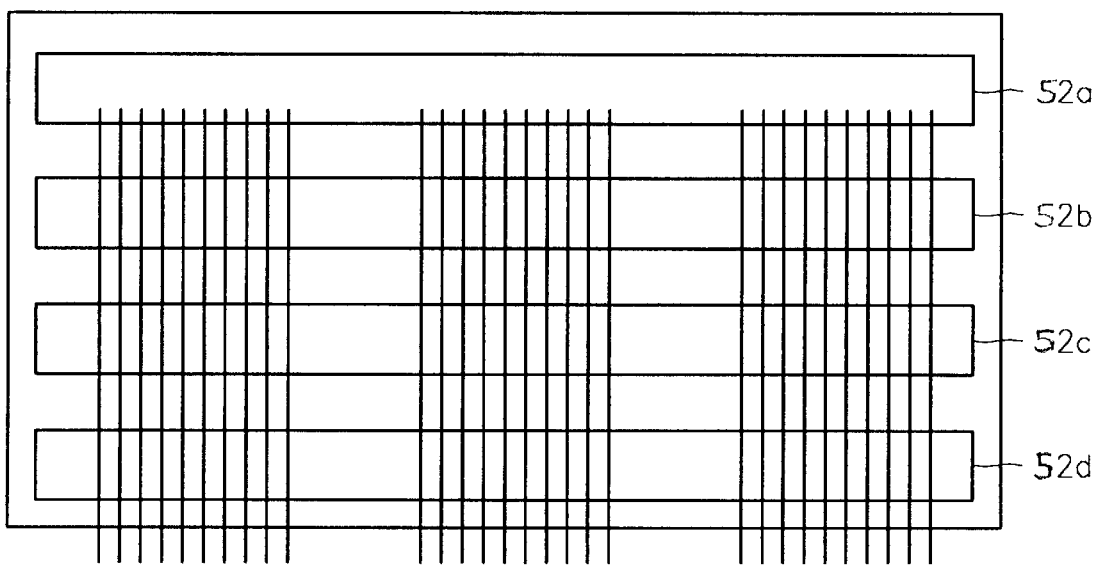
FIG. 5 is a layout diagram for wiring a board in a memory system according to the embodiment of FIG. 4 according to the present invention.

FIG. 5 describes a method for wiring a board in the memory system according to the second embodiment of the present invention, which is shown in FIG. 4. A surface mounting device (SMD) type socket used for a small outline dual in-line memory module (SoDIMM), or a through-hole socket of a commonly used dual in-line memory module (DIMM), is used in the method. Reference numerals 52a through 52d denote regions in which module sockets are provided on the system board.

The SoDIMM-type socket has an excellent electrical characteristic in a high frequency and is small, since the SoDIMM-type socket has the SMD structure. Since the through-hole sock is large, which is disadvantageous, there is more room for wiring on the system board than in a case, where the SoDIMM-type socket is used, which is advantageous.

While this invention has been particularly shown and described with references to preferred embodiments thereof, it will be understood by those skilled in the art that various changes in form and details may be made therein without departing from the spirit and scope of the invention as defined by the appended claims.

As mentioned above, the memory modules according to the present invention and the memory system according to the present invention, in which the memory modules are used, can improve the operation speed of the data bus and is suitable for widening bandwidth by extending the width of the data bus.

What is claimed is:

1. A memory system, comprising:
    a system board;
    a memory controller on the system board;
    a plurality of memory modules on the system board;
    a common control and address bus extending from the memory controller;
    data buses of a first channel extending from the memory controller; and
    data buses of a second channel extending from the memory controller; and
    wherein the memory modules of a first group are coupled to the data buses of the first channel and the memory modules of a second group are coupled to the data buses of the second channel and wherein the memory modules of the first and second groups share the common control and address bus.

2. The memory system of claim 1, wherein the memory modules are arranged so that some parts of the memory modules overlap each other.

3. The memory system of claim 1, wherein the memory modules of the first group and the memory modules of the second group are arranged to cross each other.

4. The memory system of claim 1, wherein the memory modules of the first group and the memory modules of the second group are identical in configuration.

5. The memory system of claim 1, wherein the memory modules of the first group and the memory modules of the second group are configured as mirror images of each other.

6. The memory system of claim 1, wherein each of the memory modules comprises:
    a plurality of memory devices mounted on the memory module;
    a signal input and output portion positioned on a side of the memory module, the signal input and output portion for connecting the memory module to a connector on the system board;
    a buffer mounted on the memory module; and
    a control and address bus connected between the signal input and output portion and the buffer,
    wherein the memory devices are sequentially connected to the output line of the buffer so that a signal passing through the control and address bus is input to the respective memory devices at time intervals through the buffer.

7. The memory system of claim 6, wherein the control and address bus is input through an input pin of the signal input and output portion, passes through the buffer, and is output through an output pin of the signal input and output portion, which is in the form of a short loop-through configuration.

8. The memory system of claim 6, wherein the control and address bus diverges from the common control and address bus on the system board, which is in the form of a stub configuration.

9. The memory system of claim 6, wherein each of the memory modules further comprises a plurality of data buses formed between the input pin and the output pin of the signal input and output portion in the form of the short loop-through configuration and connected to at least one memory device.

10. The memory system of claim 6, wherein the control and address bus and the buffer are arranged on a side of the memory module, and extend vertically from an edge of the memory module on which the signal input and output portion is positioned.

11. The memory system of claim 6, wherein a register is mounted on the memory module instead of the buffer.

12. The memory system of claim 1 wherein the data buses of the first channel are arranged on the left side and wherein the data buses of the second channel are arranged on the right side of the common control and address bus.

13. A memory system, comprising:
    a system board;
    a memory controller on the system board;
    a plurality of memory modules on the system board;
    a common control and address bus extending from the memory controller; and
    data buses of a first channel and data buses of a second channel, extending from the memory controller and alternately arranged from side to side in the same direction as the extension of the common control and address bus,
    wherein memory modules of a first group are loaded in the data buses of the first channel and memory modules of a second group are loaded in the data buses of the second channel, the memory modules of the first and second groups being coupled to the common control and address bus, and the memory modules of the first group and the memory modules of the second group being alternately arranged in orientation.

14. The memory system of claim 13, wherein each of the memory modules comprises:
- a plurality of memory devices mounted on the memory module;
- a signal input and output portion positioned on a side of the memory module, the signal input and output portion for connecting the memory module to a connector on the system board;
- a buffer mounted on the memory module;
- a control and address bus connected between the signal input and output portion and the buffer; and
- a plurality of data buses formed between the input pin and the output pin of the signal input and output portion in a loop-through configuration and connected to at least one memory device,
- wherein the memory devices are connected to an output line of the buffer.

15. The memory system of claim 14, wherein the control and address bus is input through an input pin of the signal input and output portion, passes through the buffer, and is output through an output pin of the signal input and output portion.

16. The memory system of claim 14, wherein the control and address bus diverges from the common control and address bus on the system board.

17. The memory system of claim 14, wherein the control and address bus and the buffer are arranged at the center of the memory module.

18. The memory system of claim 14, wherein a register is mounted on the memory module instead of the buffer.

19. A memory module, comprising:
- a plurality of memory devices mounted on the memory module;
- a signal input and output portion positioned on a side of the memory module, the signal input and output portion for connecting the memory module to a connector on a system board;
- a buffer mounted on the memory module; and
- a control and address bus connected between the signal input and output portion and the buffer,
- wherein the memory devices are sequentially connected to an output line of the buffer such that a signal passing through the control and address bus is input to the respective memory devices at time intervals through the buffer.

20. The memory module of claim 19, wherein the control and address bus is input through an input pin of the signal input and output portion, passes through the buffer, and is output through an output pin of the signal input and output portion, in the form of a short loop-through configuration.

21. The memory module of claim 19, wherein the control and address bus diverges from the control and address bus on the system board, in the form of a stub configuration.

22. The memory module of claim 19, wherein each of the memory modules further comprises a plurality of data buses formed between the input pin and the output pin of the signal input and output portion in the form of a loop-through and connected to at least one memory device.

23. The memory module of claim 19, wherein the control and address bus and the buffer are arranged vertically with respect to a side of the memory module, on which the signal input and output portion is positioned.

24. The memory module of claim 19, wherein a register is mounted on the memory module instead of the buffer.

* * * * *